(12) United States Patent
Ando et al.

(10) Patent No.: US 10,971,593 B2
(45) Date of Patent: Apr. 6, 2021

(54) OXYGEN RESERVOIR FOR LOW THRESHOLD VOLTAGE P-TYPE MOSFET

(71) Applicant: International Business Machines Corporation, Armonk, NY (US)

(72) Inventors: Takashi Ando, Tuckahoe, NY (US); Choonghyun Lee, Rensselaer, NY (US); Jingyun Zhang, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/442,047

(22) Filed: Jun. 14, 2019

(65) Prior Publication Data

US 2020/0395458 A1    Dec. 17, 2020

(51) Int. Cl.
| | |
|---|---|
| *H01L 29/66* | (2006.01) |
| *H01L 29/78* | (2006.01) |
| *H01L 29/49* | (2006.01) |
| *H01L 29/06* | (2006.01) |
| *H01L 21/311* | (2006.01) |
| *H01L 21/28* | (2006.01) |
| *H01L 21/02* | (2006.01) |

(52) U.S. Cl.
CPC .... *H01L 29/4966* (2013.01); *H01L 21/02244* (2013.01); *H01L 21/28088* (2013.01); *H01L 21/31111* (2013.01); *H01L 29/0649* (2013.01); *H01L 29/66545* (2013.01); *H01L 29/66795* (2013.01); *H01L 29/785* (2013.01)

(58) Field of Classification Search
CPC ........... H01L 29/4966; H01L 21/02244; H01L 21/28088; H01L 21/31111; H01L 29/0649; H01L 29/66545; H01L 29/66795; H01L 29/785
USPC .......................... 257/347; 438/149, 479, 517
See application file for complete search history.

(56) References Cited

U.S. PATENT DOCUMENTS

| | | | |
|---|---|---|---|
| 7,405,451 B2 | 7/2008 | Shimizu et al. | |
| 8,450,221 B2 | 5/2013 | Kirkpatrick et al. | |
| 8,497,212 B2 | 7/2013 | Babich et al. | |
| 8,643,113 B2 | 2/2014 | Chambers et al. | |
| 9,112,033 B2* | 8/2015 | Lee | H01L 29/66795 |
| 9,190,409 B2 | 11/2015 | Manabe et al. | |
| 9,570,578 B2 | 2/2017 | Lin et al. | |
| 9,673,292 B2 | 6/2017 | Huang et al. | |
| 2008/0296702 A1* | 12/2008 | Lee | H01L 29/66795 257/401 |
| 2010/0109095 A1* | 5/2010 | Li | H01L 21/82384 257/392 |
| 2011/0073952 A1* | 3/2011 | Kwok | H01L 29/7848 257/368 |

(Continued)

OTHER PUBLICATIONS

Optimized Oxygen Annealing Process for Vth Tuning of p-MOSFET with High-k/Metal Gate Stacks, T. Kawanago, et al.; Tokyo Institute of Technology.

*Primary Examiner* — Didarul A Mazumder
(74) *Attorney, Agent, or Firm* — L. Jeffrey Kelly; Lou Percello, Attorney, PLLC (57) ABSTRACT

A p-type FinFET has an oxygen reservoir disposed on the gate stack. The oxygen reservoir provides an oxygen rich environment during processing steps of manufacturing the device to help the work function metal retain or obtain oxygen to maintain or increase the work function and keep the Vth of the device lower.

20 Claims, 8 Drawing Sheets

(56) References Cited

U.S. PATENT DOCUMENTS

| | | | |
|---|---|---|---|
| 2014/0042500 A1* | 2/2014 | Wann | H01L 29/165 257/288 |
| 2015/0041855 A1* | 2/2015 | Liao | H01L 29/161 257/192 |
| 2016/0020118 A1* | 1/2016 | Park | H01L 27/092 438/592 |
| 2017/0077257 A1 | 3/2017 | Hung et al. | |
| 2017/0372906 A1 | 12/2017 | Jang et al. | |
| 2019/0131185 A1* | 5/2019 | Huang | H01L 21/32134 |

* cited by examiner

OXYGEN RESERVOIR FOR LOW THRESHOLD VOLTAGE P-TYPE MOSFET

BACKGROUND

The present invention relates to Metal Oxide Semiconductor Field Effect Transistors (MOSFETs). More specifically, the invention relates to P-type MOSFETs (PFETs) with improved electrical characteristics, like a lower threshold voltage, Vth.

Super low Vth devices are very important in critical paths of some Complementary Metal Oxide Semiconductor (CMOS) logic. Traditionally, dipole engineering is used for modulating and lowering Vth in MOSFETs used in CMOS logic. Dipole engineering uses material, e.g. Aluminum Oxide (Al2O3), that reacts with an interfacial layer, e.g. Silicon Dioxide (SiO2), between a high-k insulator and the MOSFET channel to form a dipolar region at the interface that lowers the MOSFET Vth. Unfortunately, this approach degrades carrier mobility because electrons scatter in the dipolar region when moving through the channel.

The prior art also has tried to achieve lower Vth by the selection of a metal that sets the work function of the gate stack. For example, a gate stack using Hafnium Oxide (HfO2) as the high-k gate insulator and Titanium Nitride (TiN) as the work function metal (WFM) has an equilibrium effective work function (EMF) around 4.9 electron Volts (eV).

However, instabilities caused by higher temperature conditions during processing steps in the middle of the line (MOL) and back end of the line (BEOL) make Vth reduction by metal selection difficult. Higher temperatures, e.g. over 400 degrees Celsius, redistribute oxygen in conventional gate stacks causing shifts in Vth.

Use of alternative channel materials, for example SiGe, would enable lower device Vth. However, use of these materials is complicated and costly to integrate into standard manufacturing processes.

There is a need to enable low Vth in MOSFETs, particularly in PFETs, in a way that is compatible with commonly used technologies and MOL/BEOL integration processes.

SUMMARY

Disclosed are embodiments of low Vth p-type FinFET structures and devices and methods of making them. The FinFET has a channel, a source, and a drain. A gate stack comprises a high k material disposed on the channel and a work function metal disposed on the high k material. An oxygen reservoir is disposed on the gate stack. The oxygen reservoir is made of a reservoir material that contains oxygen. The oxygen reservoir provides an oxygen rich environment during processing steps of manufacturing the device to help the work function metal retain or obtain oxygen during processing steps at higher temperatures. Work function metals that maintain or increase oxygen content have a higher work function that helps to keep the Vth of the device lower.

DETAILED DESCRIPTION

Methods and structures are disclosed that enable super low Vth (e.g., below the Vth provided by conventional HfO2/TiN gate stacks) in PFET devices with commonly used silicon channels. The invention is stable throughout MOL and BEOL integration without adding significant process complexity. This invention achieves lower Vth in PFET devices compatible with state-of-the-art manufacturing technologies.

While the invention is presented as a FinFET, one skilled in the art given this disclosure could easily use the invention in any Gate-All-Around (GAA, e.g. Stacked Nanosheet) structure.

Embodiments of this invention use a TiN, Titanium Oxynitride (TiON), Tantalum Nitride (TaN), or Tantalum Oxynitride (TaON) as a PFET work function metal. A variety of high-k dielectrics can be used. On top of the PFET work function metal (WFM), an oxygen reservoir layer (e.g. SiO2 or Silicon Oxynitride—SiON) is formed. This oxygen reservoir layer is recessed from the top portion of the gate trench to allow electrical contact to an upper WFM layer.

As used herein, "height" refers to a vertical size of an element (e.g., a layer, trench, hole, opening, etc.) in the cross-sectional or elevation views measured from a bottom surface to a top surface of the element, and/or measured with respect to a surface on which the element is located.

Conversely, a "depth" refers to a vertical size of an element (e.g., a layer, trench, hole, opening, etc.) in the cross-sectional or elevation views measured from a top surface to a bottom surface of the element. Terms such as "thick", "thickness", "thin" or derivatives thereof may be used in place of "height" where indicated.

As used herein, "width" or "length" refers to a size of an element (e.g., a layer, trench, hole, opening, etc.) in the drawings measured from a side surface to an opposite surface of the element. Terms such as "thick", "thickness", "thin" or derivatives thereof may be used in place of "width" or "length" where indicated.

As used herein, terms such as "upper", "lower", "right", "left", "vertical", "horizontal", "top", "bottom", and derivatives thereof shall relate to the disclosed structures and methods, as oriented in the drawing figures. For example, as used herein, "vertical" refers to a direction perpendicular to the top surface of the substrate in the elevation views, and "horizontal" refers to a direction parallel to the top surface of the substrate in the elevation views.

As used herein, unless otherwise specified, terms such as "on", "overlying", "atop", "on top", "positioned on" or "positioned atop" mean that a first element is present on a second element, wherein intervening elements may be present between the first element and the second element.

As used herein, unless otherwise specified, the term "directly" used in connection with the terms "on", "overlying", "atop", "on top", "positioned on" or "positioned atop," "disposed on," or the terms "in contact" or "direct contact" means that a first element and a second element are connected without any intervening elements, such as, for example, intermediary conducting, insulating or semiconductor layers, present between the first element and the second element.

It is understood that these terms might be affected by the orientation of the device described. For example, while the meaning of these descriptions might change if the device was rotated upside down, the descriptions remain valid because they describe relative relationships between features of the invention.

Unless otherwise specifically noted, the same reference numbers in different figures have the same description and refer to the same elements. Once presented, reference numbers may be omitted in later Figures for clarity.

Figure 1:
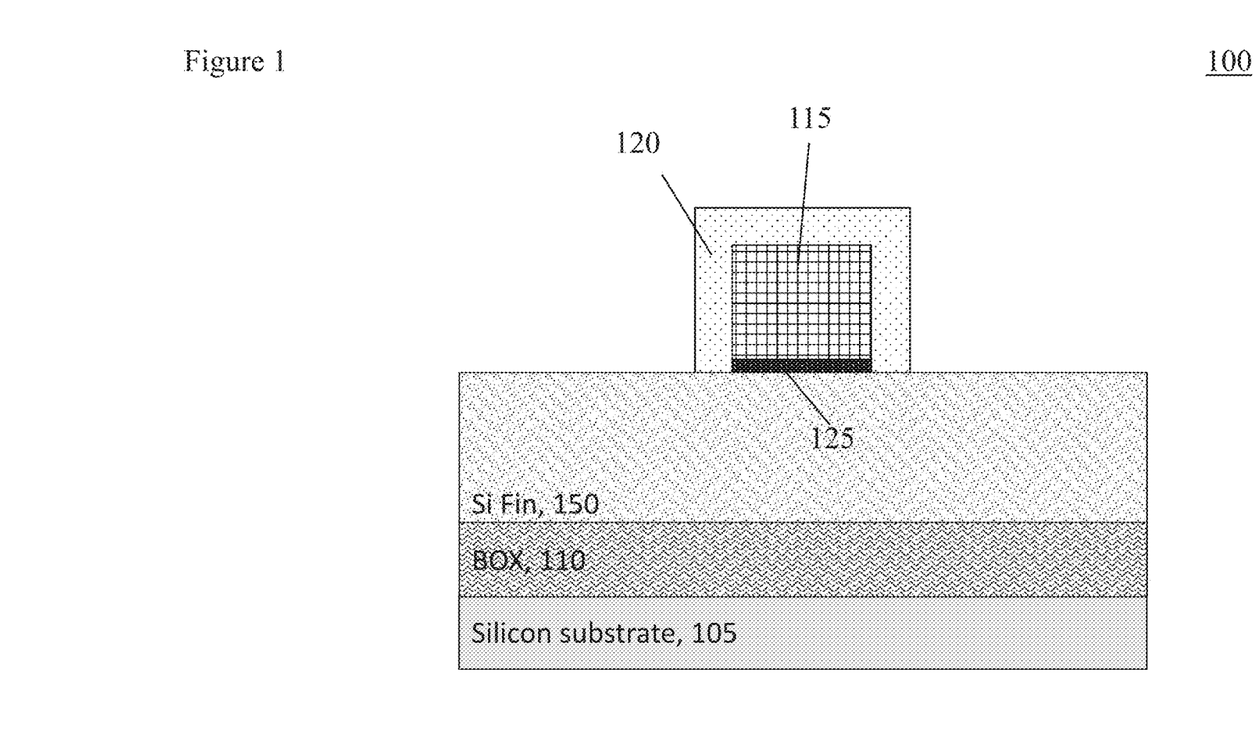
FIG. 1 is a cross section of an elevation of a beginning structure of a FINFET with a spacer around a dummy gate disposed on a dummy oxide.

The Figures are not drawn to scale. For example, the height of the dummy gate 115 is much greater than the width of the dummy gate 115.

FIG. 1 is a cross section of an elevation of a beginning structure of a FINFET 100 with a spacer 120 around a dummy gate 115. The dummy gate is disposed on a dummy oxide 125. The spacer 120, dummy gate 115, and dummy oxide are disposed on the top and the sides encompassing of one of a plurality of fins 150.

The fins 150 are made of Silicon, Si.

In some embodiments, the plurality of fins 150 is disposed on a silicon-on-insulator (SOI) structure. For example, the fins 150 are disposed on an oxide or BOX layer 110 and the BOX layer 110 is disposed on a silicon substrate 105.

In some silicon on insulator (SOI) implementations, the BOX layer 110 is a buried oxide layer oxide layer (e.g., SiO2) buried in the substrate (wafer) 105 at the depth ranging from less than 100 nanometers (nm) to several micrometers from the wafer surface depending on application. The thickness of BOX layer 110 is typically in the range from about 40 nm to about 100 nm.

In alternative embodiments, the bottom substrate 105 is made of bulk semiconductor material including, but not limited to, silicon (Si), silicon germanium (SiGe), carbon doped silicon (Si:C), carbon doped silicon germanium (SiGe:C), III-V compound semiconductors, II-V compound semiconductors, or other like semiconductor materials. In addition, multiple layers of the semiconductor materials can be used.

In some embodiments, the fins 150 are disposed directly on the bulk substrate 105 and no BOX layer 110 is included.

It is possible to purchase structures with fins 150 disposed on bulk substrates 105 and/or SOI (substrate 105 with BOX 110). Alternatively, a layer of fin material can be patterned and etched to form the fins 150.

A dummy oxide layer 125 is deposited on and encompasses the top and sides of the fin 150. The dummy oxide layer 125 is made of a material that permits later selective removal of the dummy gate 115 from a channel region of the fin 150. In some embodiments, the dummy oxide layer 125 is silicon dioxide, SiO2. Any of the methods described below that can be used to deposit the dummy gate 115 can be used to deposit the dummy oxide layer 125.

The dummy gate 115 is made of a sacrificial gate material including, for example, amorphous silicon (α-Si) or polycrystalline silicon (polysilicon). The dummy gate 115 is deposited on and encompasses the top and sides of the fin 150. Deposition processes include but are not limited to: physical vapor deposition (PVD), chemical vapor deposition (CVD), plasma enhanced chemical vapor deposition (PECVD), inductively coupled plasma chemical vapor deposition (ICP CVD), or any combination thereof.

In some embodiments, the sacrificial material forming the dummy gate 115 has a height of about 30 nm to about 150 nm, or alternatively from about 30 nm to about 100 nm. In some embodiments, the dummy gate 115 has a width of between 10 nm and 50 nm or alternatively about 10 nm. Other heights and widths are possible.

Next a spacer 120 material is disposed on and around the dummy gate 115, encompassing the top and sides of the fin 150. In some embodiments, the spacer 120 is disposed conformally with a width/thickness between 3 and 10 nm. In alternative embodiments, the spacer 120 thickness is about 5 nm to 7 nm.

The spacer 120 can be made of materials including: dielectric oxides (e.g., silicon oxide), dielectric nitrides e.g., silicon nitride), dielectric oxynitrides, or any combination thereof.

Figure 2:
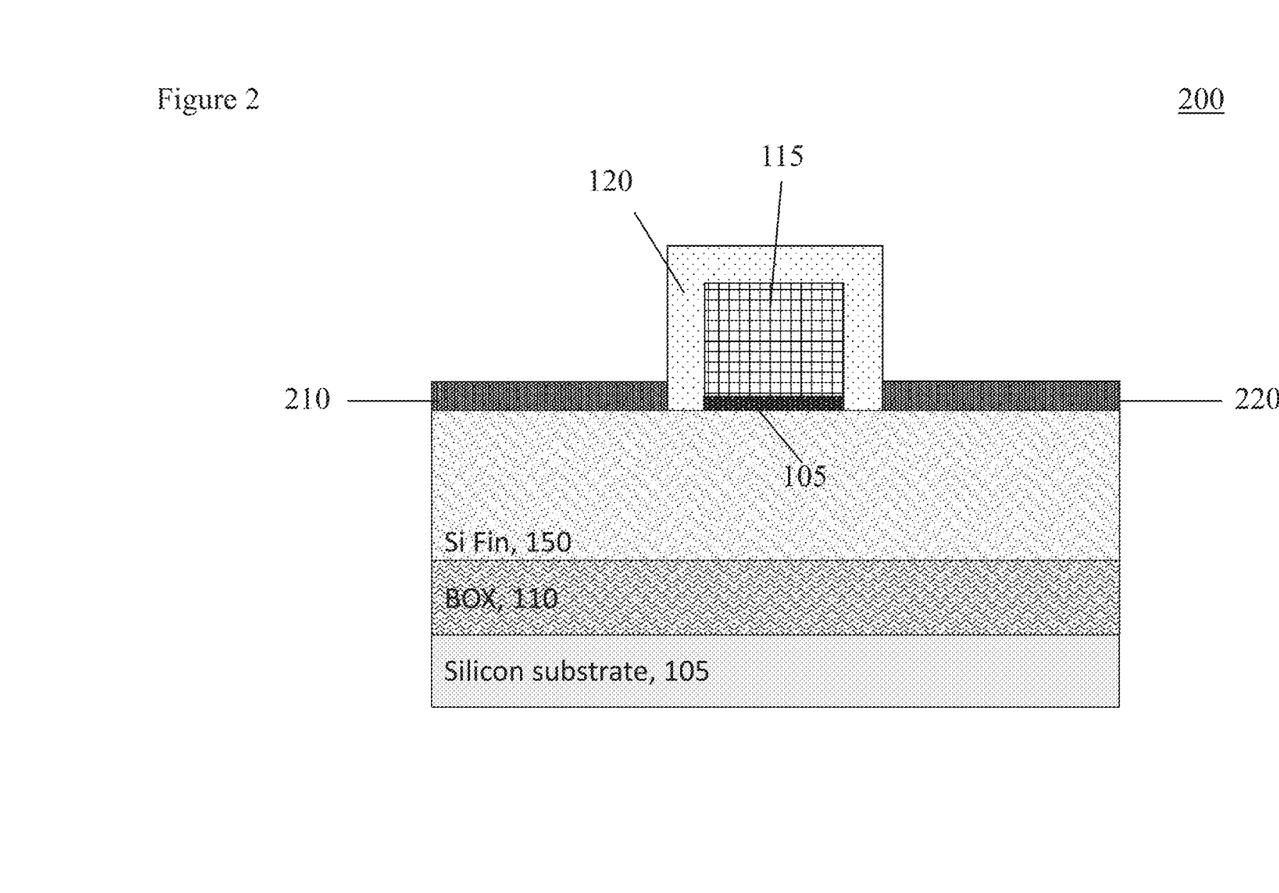
FIG. 2 is a cross section of an elevation of a FINFET interim structure after the step of adding a source and a drain.

FIG. 2 is a cross section of the elevation of the structure 200 after the step of adding a drain 210 and a source 220.

This p-channel FET (PFET) structure 200 is made by doping the drain region 210 and source region 220 with a p-type dopant. The drain 210 and source 220 can be formed by epitaxial growth on the fin 150.

In some embodiments, the drain 210 and source 220 are heavily doped, including a dopant concentration in a range from about $4 \times 10^{20}$ cm$^{-3}$ to about $2.5 \times 10^{21}$ cm$^{-3}$. The thickness of the doped drain 210 and source 220 may be in a range from about 50 nm to about 250 nm, or from about 70 nm to about 100 nm.

Dopants may include, for example, a p-type dopant selected from a group of boron (B), gallium (Ga), indium (In), and thallium (Tl).

The drain 210 (source 220) is electrically, chemically, and physically connected to a drain side (source side) of the channel (480, see below), respectively.

Figure 3:
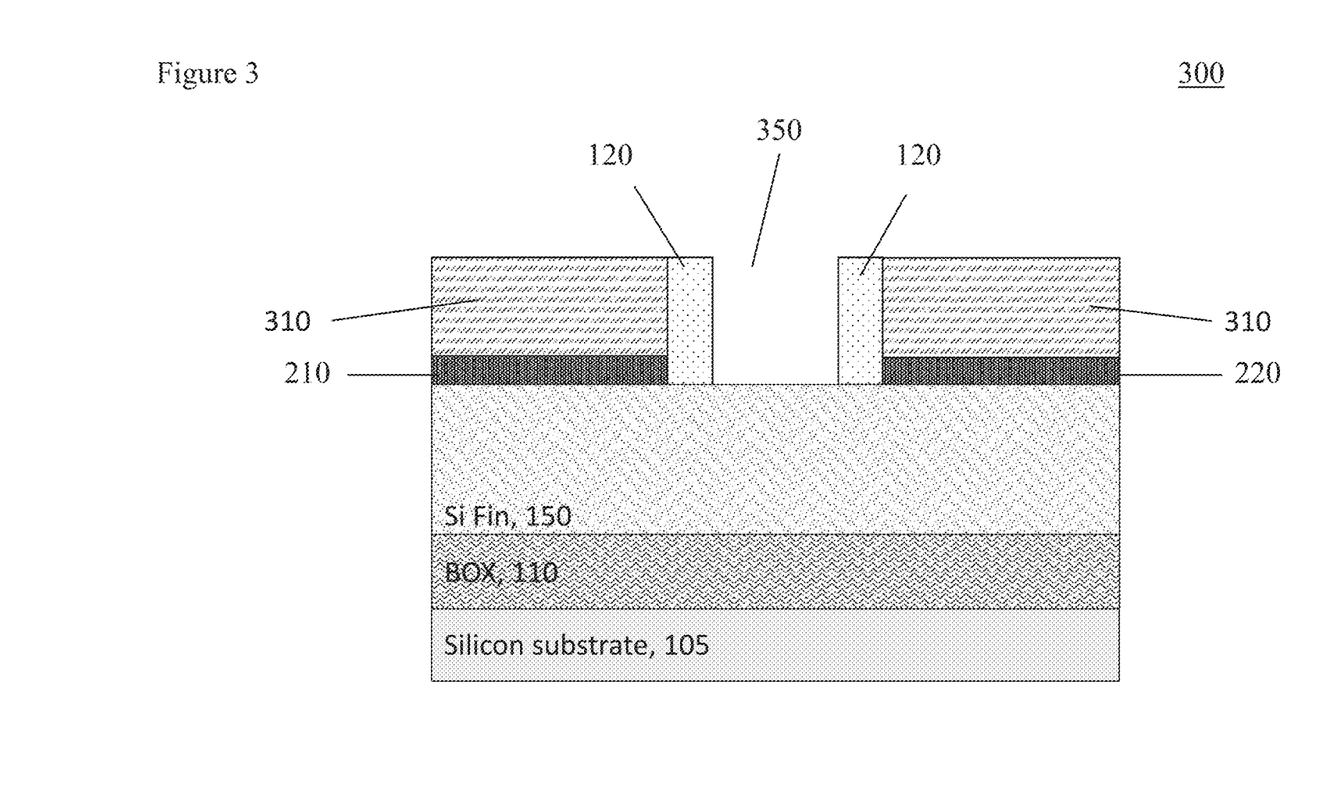
FIG. 3 is a cross section of an elevation of a FINFET interim structure after the steps of adding an interlayer dielectric (ILD) layer, performing a chemical and mechanical polishing (CMP), and removing the dummy gate and dummy oxide.

FIG. 3 is a cross section of an elevation of the FINFET structure 300 after the steps of adding an interlayer dielectric (ILD) layer 310 and performing a chemical and mechanical polishing (CMP). The dummy gate 115 and the dummy oxide 125 are also removed.

The material in the ILD 310 can be a low-k dielectric material (with k<4.0), including but not limited to, silicon oxide, spin-on-glass, a flowable oxide, a high-density plasma oxide, or any combination thereof. The ILD 310 is deposited by a deposition process, including, but not limited to: CVD, PVD, PECVD, atomic layer deposition (ALD), evaporation, chemical solution deposition, or like processes.

The CMP levels the top of the structure 300 and removes the "overlayer" of the spacer 120 over the dummy gate 115 so that the tops of the spacer 120, the top of the dummy gate 115, and the top of the ILD 310 are coplanar.

Then the dummy gate 115 is removed by a dry etch or exposure to a hot ammonium hydroxide (NH4OH), deionized water, hydrogen peroxide (H2O2), and/or any similar standard SC1 cleaning processes. The dummy oxide 125 protects the channel 480 while the dummy gate 115 is removed. In some embodiments, a selective, direction reactive ion etch (RIE) process then removes the dummy oxide 125.

After the dummy gate 115 and dummy oxide 125 are removed, a gate trench 350 void is created between the two spacers 120.

Figure 4:
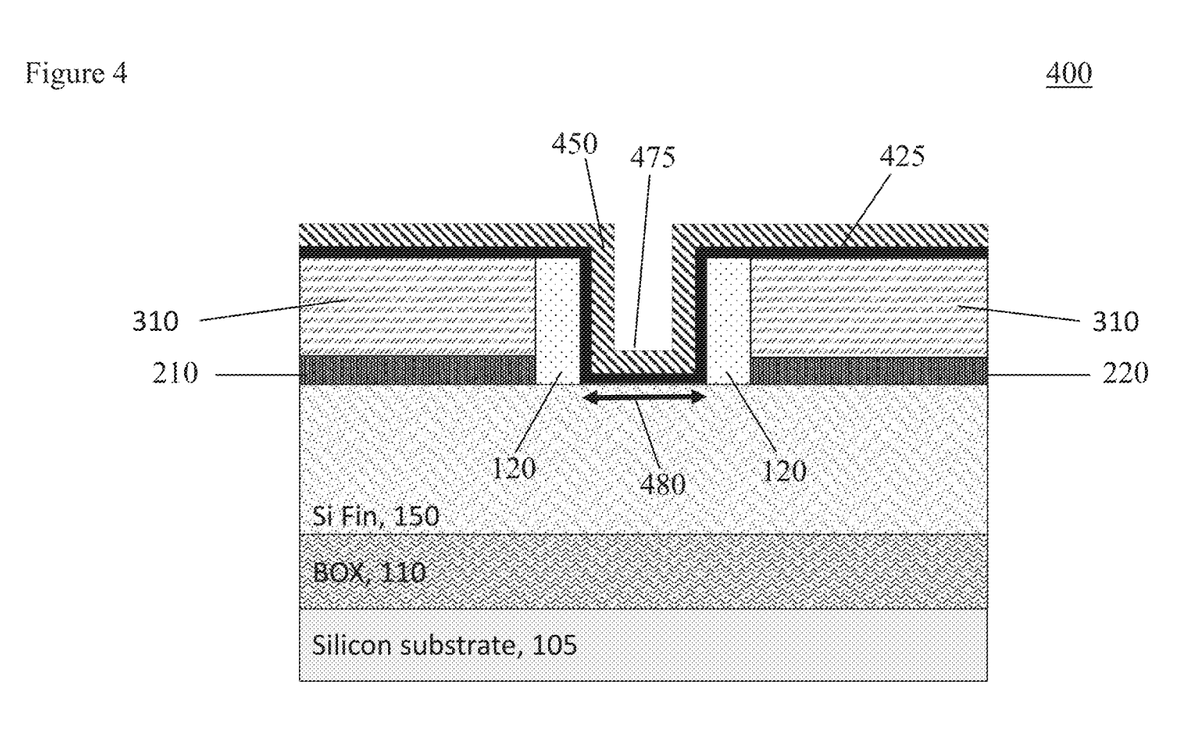
FIG. 4 is a cross section of an elevation of a FINFET interim structure after deposition of a high-k dielectric and a work function metal (WFM).

FIG. 4 is a cross section of the elevation of a FINFET interim structure 400 after creating a gate stack 475 by a deposition of a high-k dielectric 425 and a work function metal (WFM) 450.

The gate 475 high k dielectric material(s) 425 can be a dielectric material having a dielectric constant greater than 3.9, 7.0, or 10.0. Non-limiting examples of suitable materials for the gate dielectric material 425 include oxides, nitrides, oxynitrides, silicates (e.g., metal silicates), aluminates, titanates, or any combination thereof. Other examples of high-k materials (with a dielectric constant greater than 7.0) that can be used include, but are not limited to, metal oxides such as hafnium oxide (HfO2), hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material may further include dopants such as, for example, lanthanum and aluminum.

The gate 475 dielectric material 425 layer may be formed by a conformal deposition processes, for example, CVD, PVD, PECVD, ALD, evaporation, chemical solution deposition, or other like processes.

The thickness of the gate dielectric material 425 may vary depending on the deposition process as well as the composition and number of high-k dielectric materials used. In some embodiments, the thickness of the gate dielectric material 425 is between 1 nm and 3 nm.

The p-type WFM layers 450 include: TiN, TiON, TaN, and TaON. In some embodiments, these WFMs 450 are conformally deposited using, for example, deposition techniques including, but not limited to: CVD, PECVD, RFCVD, PVD, ALD, LSMCD, Pulsed Laser Deposition (PLD), Liquid Source Misted Chemical Deposition (LSMCD), and/or sputtering.

The thickness of the WFM layer 450 is between 1 nm and 10 nm.

In alternative embodiments, the WFM layer 450 comprises more than one deposition layer. By depositing more than one layer with an air-break between two adjacent layers (pairs of layers), Vth can be reduced. In some embodiments, Vth is reduced by up to 50 millivolts (mV). For example, oxygen between layers of TiN can combine with the TiN to form TiON during some of the higher temperature processing steps. Alternatively, oxygen in the air-breaks can create an oxygen environment where TiON or TaON used as a WFM will not lose an oxygen atom and convert to TiN and TaN, respectively. Since TiON (TaON) has a higher work function (WF) than TiN (TaN), the WFM layer 450 having TiON (TaON) has a higher WF which helps to a lower Vth gate.

In some embodiments, the multiple WFM deposition layers 450 are deposited by ALD. For example, each WFM deposition layer 450 is between 2 to 20 angstroms thick, preferably between 4 to 6 angstroms thick. After each of the WFM deposition layers 450 is deposited, the surface of the WFM layer 450 is exposed to an oxygen environment. In some embodiments, the surface of each of the WFM deposition layers 450 is exposed to air. In other embodiments, the surface of each of the WFM deposition layers is oxidized, e.g. with an oxygen containing plasma.

Figure 5:
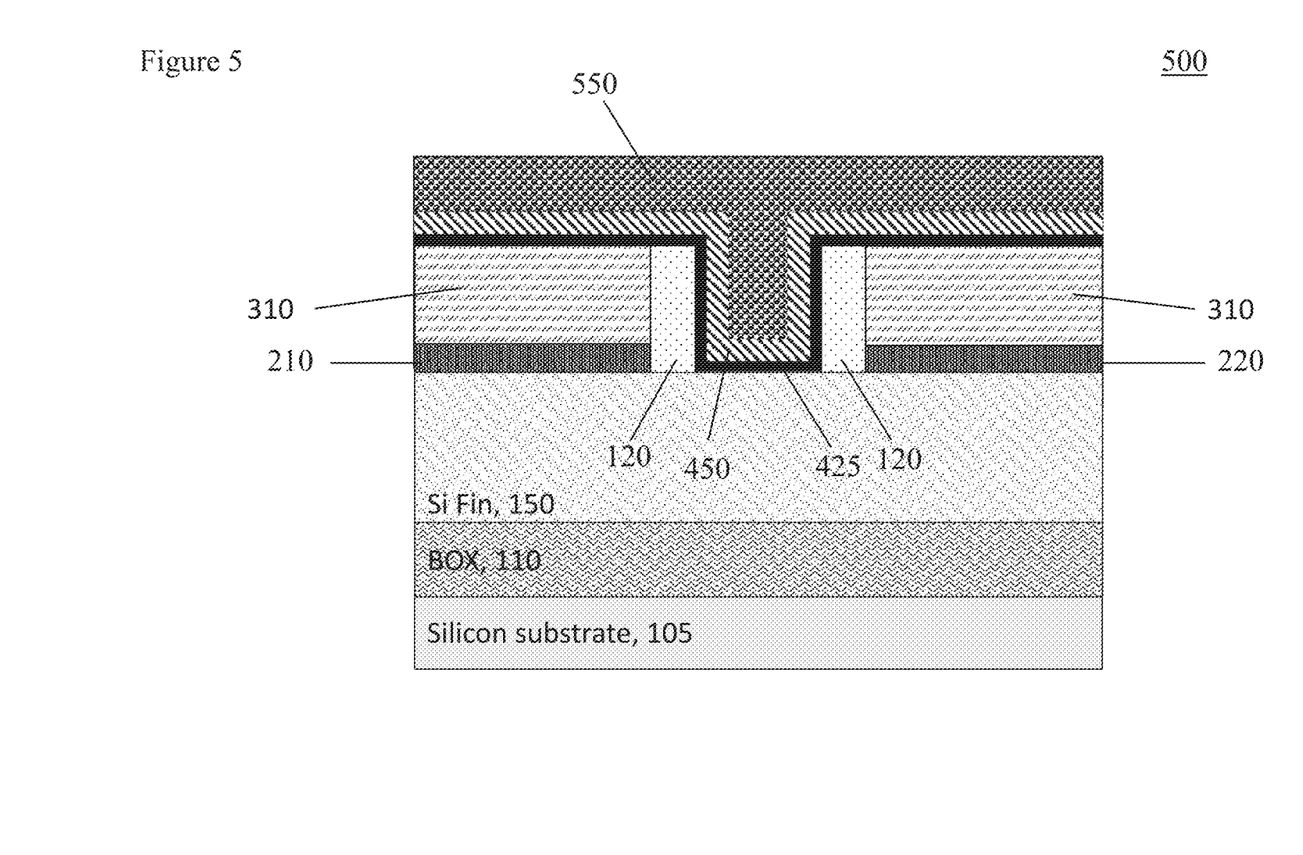
FIG. 5 is a cross section of an elevation of a FINFET interim structure after deposition of an oxygen reservoir layer.

FIG. 5 is a cross section of the elevation of a FINFET interim structure 500 after the step of deposition of an oxygen reservoir layer 550.

The material in the oxygen reservoir layer 550 is an oxygen containing material. In some embodiments, the material in the oxygen reservoir layer 550 is SiO2 or Silicon Oxynitride (SiON). These materials are compatible with standard semiconductor processes.

The oxygen reservoir layer 550 is deposited by any standard deposition method, including but not limited to: CVD, PECVD, RFCVD, PVD, ALD, PLD, LSMCD, and/or sputtering.

Enough oxygen reservoir layer 550 material is deposited over the WFM layer 450 to fill the remaining space in the gate trench 350, In addition, the oxygen reservoir layer 550 covers over the WFM layer 450 and the high-k dielectric 425 on the top of the structure with a thickness of at least 1 to 3 nm outside of the gate trench 350.

Figure 6:
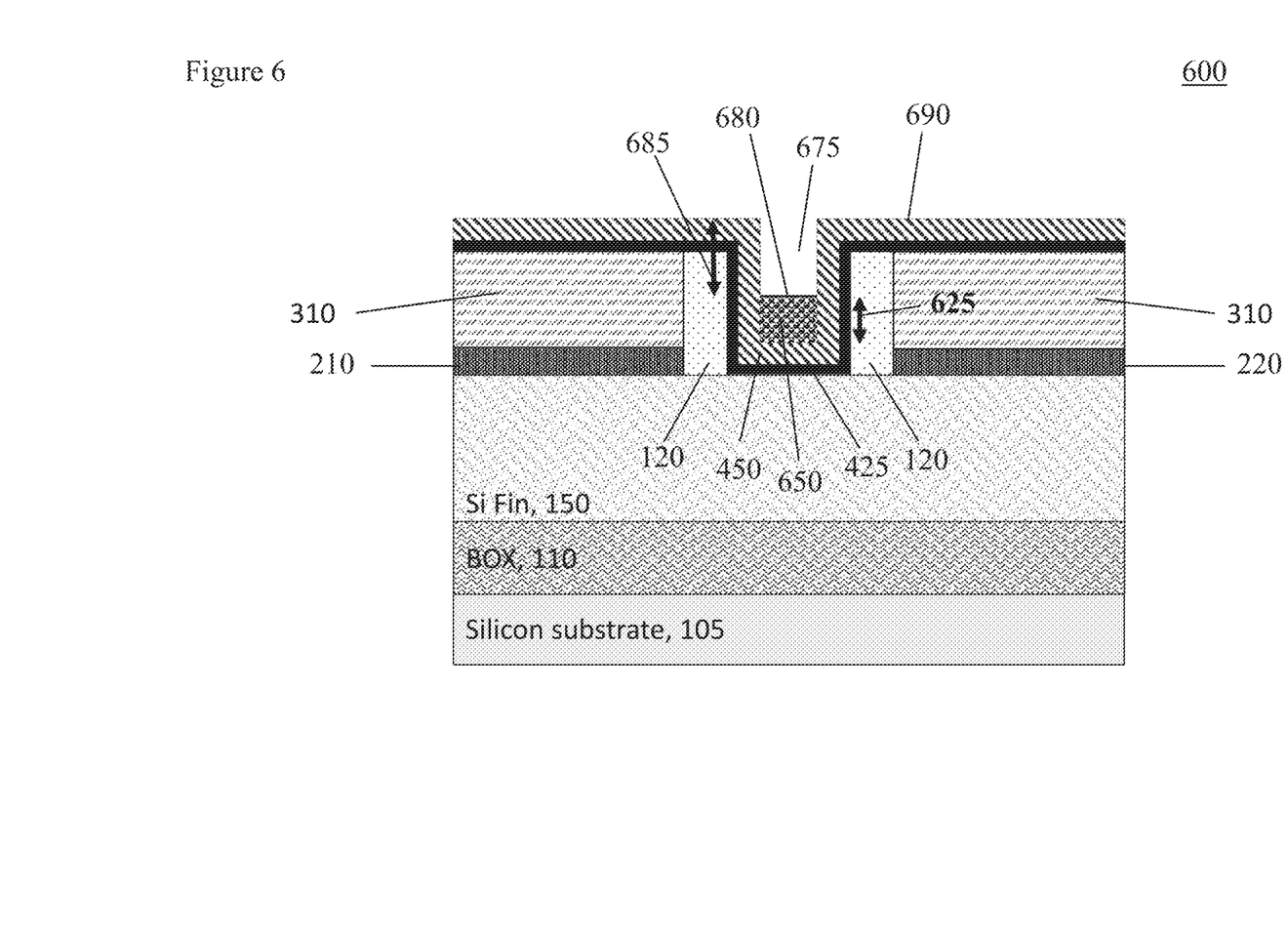
FIG. 6 is a cross section of an elevation of a FINFET interim structure after recessing the oxygen reservoir layer.

FIG. 6 is a cross section of the elevation of a FINFET interim structure 600 after the step of recessing the oxygen reservoir layer 550.

The oxygen reservoir layer 550 is recessed by an etch back process like directional RIE or a wet etch. In some embodiments, the etch back is selective to the material used for the oxygen reservoir layer 550 and the etch back can be time controlled to create a precise thickness 625 of the oxygen reservoir 650 remaining within the gate trench 350. In some embodiments the height/thickness 625 of the oxygen reservoir 650 is between 1 nm and 10 nm. By controlling the thickness 625 of the oxygen reservoir 650, the amount of material in the oxygen reservoir layer 550 remaining in the gate trench 350 is controlled and therefore the amount of oxygen available from the oxygen reservoir 650 is also controlled.

Since the oxygen reservoir thickness 625 does not fill the entire gate trench 350, there remains a connection void 675 within the gate trench 350 above the oxygen reservoir 650. Part of the WFM layer 450 is exposed on the sides of the connection void 675. The top 680 of the oxygen reservoir 650 is exposed as well. The depth 685 of the connection void 675 and therefore the amount of distance (depth) 685 the reservoir 650 is recessed below a top surface 690 of the structure 600 due to the etch back process is between 20 nm and 200 nm.

Figure 7:
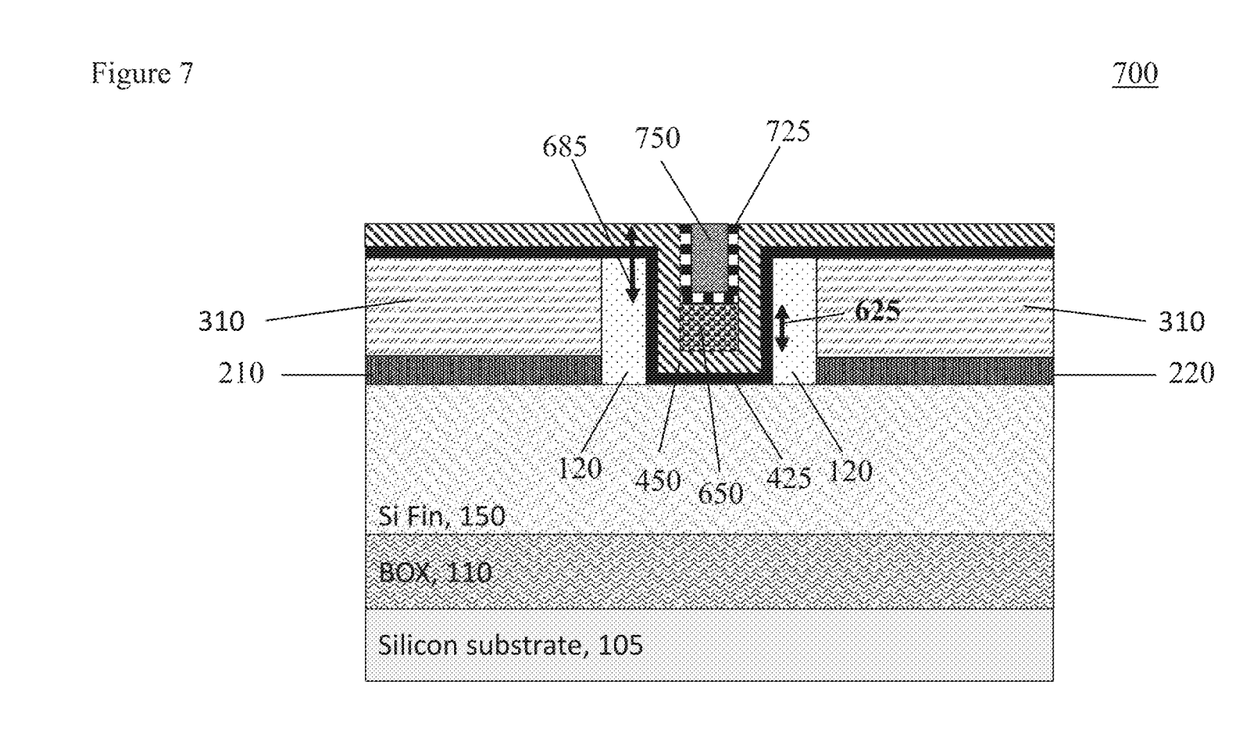
FIG. 7 is a cross section of the elevation of a FINFET structure after depositing a metal liner, depositing a low resistivity metal fill, and performing a CMP.

FIG. 7 is a cross section of the elevation of a FINFET structure 700 after the steps of depositing a metal liner 725 (optionally), depositing a low resistivity metal fill 750, and performing a CMP.

The exposure of the WFM layer 450 on the sides of the connection void 675 allows connection to the WFM layer 450 within the gate trench 350.

In some embodiments, a conductive liner 725 is deposited on the exposed top 680 of the oxygen reservoir 650 and on the WFM layer 450 both within the gate trench 350 and on the top surface of the structure 700.

In some embodiments, the conductive liner 725 is conformally deposited to a thickness between 1 nm to 5 nm by the methods including, but not limited to: CVD, PECVD, RFCVD, PVD, ALD, PLD, LSMCD, and/or sputtering. The conductive liner 725 can be made of any conductive material. In some embodiments, the conductive liner 725 is made of TiN.

The conductive liner 725 is in electrical and physical contact with both the top 680 of the oxygen reservoir 650 and the WFM 450 exposed on the sides of the spacers 120 in the gate trench 350 above the oxygen reservoir 650, e.g. covering the surfaces of the connection void 675 over the entire recessed depth 685. This larger area of electrical contact between the conductive liner 725 and the WFM 450 decreases contact resistance.

Then a deposited low resistivity metal layer 750 fills the remaining open space in the gate trench 350. In an embodiment, the low resistivity metal layer 750 is used as an electrical contact to the gate (425, 450) and is made of the following materials, including but not limited to: tungsten (W), Aluminum (Al), Copper (Cu), and Cobalt (Co). The low resistivity metal layer 750 is deposited by the methods including but not limited to: CVD, PECVD, RFCVD, PVD, ALD, PLD, LSMCD, and/or sputtering.

In alternative embodiments, the conductive liner 725 is not deposited and the low resistivity metal layer 750 physically and electrically directly connects to the top 680 of the oxygen reservoir 650 and the WFM layer 450 exposed within the gate trench 350 over the surfaces of connection void 675 over the entire recessed depth 685.

In some embodiments, there is a CMP of the surface of structure 700 to remove from the surface the WFM layer 450, the high-k dielectric 425, and any residual conductive liner 725 and low resistivity metal layer 750 material so that the tops of the ILD 310, spacers 120, WFM layer 450, high-k dielectric 425, conductive liner 725, and low resistivity metal layer 750 within the gate trench 350 are co-planar. In some embodiments, Vias (not shown) can penetrate the ILD 310. The vias are then filled with conductive material to form connections with the drain 210 and source 220.

The structure 700 is now ready to continue with the processes in the MOL/BEOL. Were it not for the oxygen reservoir 650, temperatures above 400 degree Celsius in the MOL/BEOL would destablize materials in the WFM 450. For example, TiON and TaON would tend to lose oxygen atoms and form TiN and TaN, respectively. The TiN and TaN materials have a lower WF than the TiON and TaON materials, respectively, and therefore these higher temperature steps can shift (increase) the Vth of the device as much as 150 mV.

Since the oxygen reservoir 650 creates an oxygen rich environment during these higher temperature exposures, there is less oxygen loss from the TiON and TaON materials (and in some cases even addition of O2 to TiN (TaN) to form TiON (TaON), each case tending to decrease Vth.

Experimental results show that for a structure 700 with an oxygen reservoir 650, Vth increases less than 55 mV in the MOL/BEOL.

Devices with an oxygen reservoir 650 have an equilibrium effective work function (EWF) of 5.0 eV or greater which is at least a 100 mV increase over the prior art EWF of 4.9 eV for gate stacks described above. A higher EWF has the effect reducing the Vth.

Figure 8:
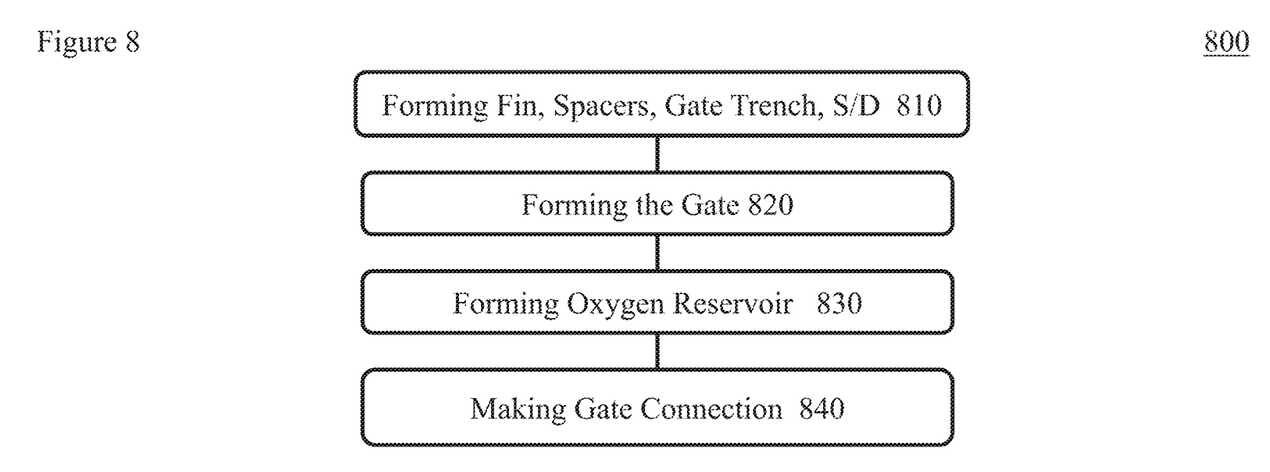
FIG. 8 is a flow chart of the steps of a method for making a low Vth PFET.

FIG. 8 is a flow chart 800 of the steps of a method for making a low Vth PFET.

Step 810 begins by constructing one or more fins 150 with the spacers 120 encompassing the top and sides of the fin 150 to form a gate trench 350, and further forming the source 220 and drain 210, as described in the description of FIGS. 1 through 3.

In step 820 there is deposition of the high-k dielectric 425 and the work function metal (WFM) 450 forming the gate stack/gate 475.

In step 830 the oxygen reservoir 650 is formed as described in the description of FIGS. 5 and 6.

In step 840 an electrical connection is made to the gate 475.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

We claim:

1. A p-type FinFET comprising:
   a channel;
   a source electrically connected to a source side of the channel; a drain electrically connected to a drain side of the channel;
   a gate stack comprising a high k dielectric material disposed on the channel and a work function metal disposed on the high k dielectric material; and
   an oxygen reservoir disposed on the gate stack, the oxygen reservoir made of a reservoir material, the reservoir material containing oxygen, the oxygen reservoir having a top surface; and
   a metal liner or a low resistivity metal fill directly connected to the top surface.

2. The p-type FinFET, as in claim 1, where the channel is made of Silicon (Si).

3. The p-type FinFET, as in claim 1, where the reservoir material is one of: Silicon Dioxide (SiO2) and Silicon Oxynitride (SiON).

4. The p-type FinFET, as in claim 1, where the work function metal (WFM) is one of: Titanium Nitride (TiN), Titanium Oxynitride (TiON), Tantalum Nitride (TaN), and Tantalum Oxynitride (TaON).

5. The p-type FinFET, as in claim 1, where the work function metal (WFM) is formed with layers of two or more deposition layers.

6. The p-type FinFET, as in claim 5, where each of the deposition layers is between 2 and 20 angstroms thick.

7. The p-type FinFET, as in claim 5, where one or more pairs of adjacent deposition layers has an oxygen containing layer between the layers of two or more deposition layers.

8. The p-type FinFET, as in claim 1, where a top of the oxygen reservoir is recessed below a top surface of the replacement metal gate.

9. The p-type FinFET, as in claim 8, where the top of the oxygen reservoir is recessed below the top surface of the replacement metal gate between 20 nanometers (nm) and 200 nm.

10. The p-type FinFET, as in claim 1, where the work function metal has an effective work function (EWF) of 5.0 electron Volts (eV) or greater.

11. A p-type FinFET comprising:
    a channel;
    a source electrically connected to a source side of the channel;
    a drain electrically connected to a drain side of the channel;
    a gate stack comprising a high k dielectric material disposed on the channel and a work function metal (WFM) disposed on the high k dielectric material;
    an oxygen reservoir disposed on the gate stack, the oxygen reservoir made of a reservoir material, the reservoir material containing oxygen; and a low resistivity metal layer contact electrically connected to the work function metal (WFM) as well as being physically disposed above a top of the oxygen reservoir.

12. The p-type FinFET, as in claim 11, where the low resistivity metal layer contact is made of one or more of the following: tungsten (W), Aluminum (Al), Copper (Cu), and Cobalt (Co).

13. The p-type FinFET, as in claim 11, further comprising a conductive liner, the conductive liner disposed between the low resistivity metal layer contact and the work function metal (WFM) and being on the top of the oxygen reservoir.

14. The p-type FinFET, as in claim 13, where the conductive liner is Titanium Nitride (TiN).

15. The p-type FinFET, as in claim 11, that is one of the following: a planar FET, a Gate-All-Around (GAA) structure, and a Stacked Nanosheet structure.

16. A method of making a p-type FinFET, comprising the steps of:
   forming a gate trench between a first and second spacer disposed on a fin,
   forming a source on a source side of the first spacer and a drain on a drain side of the second spacer, a channel being a region of the fin between the first and second spacer;
   depositing a high-k dielectric within the gate trench on the channel and on one side of each of the spacers exposed within the gate trench;
   depositing a work function metal (WFM) on the high-k dielectric to form a gate stack above the channel;
   depositing an oxygen reservoir on the gate stack; and
   depositing a low resistivity metal layer contact electrically connected to the work function metal as well as being physically disposed above a top of the oxygen reservoir.

17. The method of making the p-type FinFET, as in claim 16, where the WFM is deposited in two or more deposition layers.

18. The method of making the p-type FinFET, as in claim 17, where there is a layer of oxygen containing material formed between two of the deposition layers.

19. The method of making the p-type FinFET, as in claim 18, where the oxygen containing material is formed by one of the following:
   a. exposing a first deposition layer to air before depositing a second deposition layer, and
   b. oxidizing the deposition layer before depositing the second deposition layer.

20. The method of making the p-type FinFET, as in claim 16, further comprising the step of etching back a top of the oxygen reservoir into the gate stack so the top of the oxygen reservoir is recessed below a top surface of the replacement metal gate between 20 nm and 200 nm.

\* \* \* \* \*